US012764879B2

(12) United States Patent
Kim et al.

(10) Patent No.: US 12,764,879 B2
(45) Date of Patent: Oct. 13, 2026

(54) HINGE AND FOLDABLE DISPLAY INCLUDING THE SAME

(71) Applicants: Samsung Display Co., LTD., Yongin-si (KR); AUFLEX Co., Ltd., Hwaseong-si (KR)

(72) Inventors: Se Yong Kim, Yongin-si (KR); Myoung Ho Lim, Ansan-si (KR); Seoung Jun Lee, Uiwang-si (KR)

(73) Assignees: Samsung Display Co., Ltd., Yongin-si (KR); AUFLEX Co., Ltd., Hwaseong-si (KR)

( * ) Notice: Subject to any disclaimer, the term of this patent is extended or adjusted under 35 U.S.C. 154(b) by 375 days.

(21) Appl. No.: 18/457,425

(22) Filed: Aug. 29, 2023

(65) Prior Publication Data

US 2024/0074075 A1 Feb. 29, 2024

(30) Foreign Application Priority Data

Aug. 30, 2022 (KR) ........................ 10-2022-0109159

(51) Int. Cl.

| | |
|---|---|
| ***H05K 5/00*** | (2025.01) |
| ***F16C 11/04*** | (2006.01) |
| ***H05K 5/02*** | (2006.01) |

(52) U.S. Cl.

CPC ............ *H05K 5/0226* (2013.01); *F16C 11/04* (2013.01)

(58) Field of Classification Search

CPC .............................. H05K 5/0226; F16C 11/04

See application file for complete search history.

(56) References Cited

U.S. PATENT DOCUMENTS

| | | | | |
|---|---|---|---|---|
| 11,379,013 | B2 * | 7/2022 | Cha | G06F 1/1652 |
| 11,644,874 | B2 * | 5/2023 | Kuramochi | G06F 1/1616 361/679.27 |
| 11,886,254 | B2 * | 1/2024 | Kim | G06F 1/1681 |
| 12,541,230 | B2 * | 2/2026 | Liao | G06F 1/1681 |
| 2020/0348732 | A1 * | 11/2020 | Kang | G06F 1/1681 |
| 2021/0165466 | A1 * | 6/2021 | Kang | G06F 1/1681 |
| 2021/0181808 | A1 * | 6/2021 | Liao | H04M 1/0216 |

FOREIGN PATENT DOCUMENTS

| | | |
|---|---|---|
| KR | 10-1506803 | 3/2015 |
| KR | 10-2085235 | 3/2020 |
| KR | 10-2197040 | 12/2020 |
| KR | 10-2021-0054954 | 5/2021 |

* cited by examiner

*Primary Examiner* — Imani N Hayman
*Assistant Examiner* — Rashen E Morrison
(74) *Attorney, Agent, or Firm* — Lerner David LLP

(57) ABSTRACT

A hinge includes a first shaft and a second shaft that are parallel to each other, first and third arms rotatably coupled to the first shaft and including first and third rotary cams, second and fourth arms rotatably coupled to the second shaft and including second and fourth rotary cams, a first sliding part coupled to the first and second shafts to be movable along the first and second shafts and including a first sliding cam facing the first rotary cam and a second sliding cam facing the second rotary cam, a second sliding part coupled to the first and second shafts to be movable along the first and second shafts and including a third sliding cam facing the third rotary cam and a fourth sliding cam facing the fourth rotary cam, and an elastic member disposed between the first sliding part and the second sliding part.

18 Claims, 14 Drawing Sheets

HINGE AND FOLDABLE DISPLAY INCLUDING THE SAME

CROSS-REFERENCE TO RELATED APPLICATION(S)

This application claims priority to and benefits of Korean Patent Application No. 10-2022-0109159, filed in the Korean Intellectual Property Office on Aug. 30, 2022, the entire contents of which are incorporated herein by reference.

BACKGROUND

1. Technical Field

This disclosure relates to a hinge and a foldable display including the same.

2. Description of the Related Art

An electronic device such as a smartphone, a mobile phone, a tablet PC, a multimedia player, a television, or a monitor includes a display device for displaying an image. The display device includes a display panel that implements a screen displaying the image. A flexible display device capable of changing shape such as bending, folding, rolling, and stretching using a flexible substrate as a substrate for a display panel has been developed.

Among flexible display devices, a foldable display device may be folded and unfolded like a book. The foldable display device has an advantage of being able to be folded and compactly carried, and when desired, it may be unfolded to enjoy a wide screen.

The above information disclosed in this Background section is only for enhancement of understanding of the background, and therefore it may contain information that does not form the prior art that is already known in this country to a person of ordinary skill in the art.

SUMMARY

In order to fold and unfold a foldable display device, a mechanical structure such as a hinge may be required. It may be desirable that such a mechanical structure is small in size and robust, and that an operation of folding and unfolding the display device is smoothly performed.

Embodiments are to provide a hinge and a foldable display device including the same capable of smoothly performing an operation of folding and unfolding a foldable display device.

A hinge according to an embodiment may include a first shaft and a second shaft that are parallel to each other, a first arm rotatably coupled to the first shaft and including a first rotary cam, a second arm rotatably coupled to the second shaft and including a second rotary cam, a third arm rotatably coupled to the first shaft and including a third rotary cam, a fourth arm rotatably coupled to the second shaft and including a fourth rotary cam, a first sliding part coupled to the first shaft and the second shaft to be movable along the first shaft and the second shaft and including a first sliding cam facing the first rotary cam and a second sliding cam facing the second rotary cam, a second sliding part coupled to the first shaft and the second shaft to be movable along the first shaft and the second shaft and including a third sliding cam facing the third rotary cam and a fourth sliding cam facing the fourth rotary cam, and an elastic member disposed between the first sliding part and the second sliding part.

The first sliding part and the second sliding part may linearly move towards to or away from each other in response to rotations of the first arm, the second arm, the third arm, and the fourth arm. The elastic member may be compressed or stretched in response to linear movements of the first sliding part and the second sliding part.

The elastic member may include a first elastic member disposed between the first sliding cam and the third sliding cam, a second elastic member disposed between the second sliding cam and the fourth sliding cam, and a third elastic member disposed between the first elastic member and the second elastic member.

An end of each of the first elastic member, the second elastic member, and the third elastic member may be in physical contact with the first sliding part, and another end of each of the first elastic member, the second elastic member, and the third elastic member may be in physical contact with the second sliding part.

The first elastic member may surround the first shaft, and the second elastic member may surround the second shaft.

The hinge may further include a pin coupled to the first sliding part and the second sliding part. The third elastic member may surround the pin.

The hinge may further include: a first bracket connecting the first arm and the third arm, and a second bracket connecting the second arm and the fourth arm.

The hinge may further include a first connection gear and a second connection gear that are disposed between the first arm and the second arm and engaged with each other, and a third connection gear and a fourth connection gear that are disposed between the third arm and the fourth arm and engaged with each other. The first arm, the second arm, the third arm, and the fourth arm may include gears respectively engaging with the first connection gear, the second connection gear, the third connection gear, and the fourth connection gear.

By engagement between the gears of the first arm, the second arm, the third arm, and the fourth arm and the first connection gear, the second connection gear, the third connection gear, and the fourth connection gear, the second arm and the fourth arm may rotate counterclockwise around the second shaft in case that the first arm and the third arm rotate clockwise around the first shaft.

The hinge may further include a first pin and a second pin passing through the first sliding part and the second sliding part. The first connection gear and the third connection gear may be rotatably coupled to the first pin, and the second connection gear and the fourth connection gear may be rotatably coupled to the second pin.

A foldable display device according to an embodiment may include a first body, a second body, and a hinge unit physically connected to the first body and the second body. The hinge unit may include a hinge housing and a hinge coupled to the hinge housing. The hinge may include a first fixing member and a second fixing member that are coupled to the hinge housing and spaced apart from each other in a direction of a rotation axis of the foldable display device, a first shaft and a second shaft that are inserted into the first fixing member and the second fixing member and parallel to the rotation axis, a first arm rotatably coupled to the first shaft and including a first rotary cam, a second arm rotatably coupled to the second shaft and including a second rotary cam, a third arm rotatably coupled to the first shaft and including a third rotary cam, a fourth arm rotatably coupled to the second shaft and including a fourth rotary cam, a first sliding part coupled to the first shaft and the second shaft to be movable along the first shaft and the second shaft and including a first sliding cam facing the first rotary cam and a second sliding cam facing the second rotary cam, a second sliding part coupled to the first shaft and the second shaft to be movable along the first shaft and the second shaft and including a third sliding cam facing the third rotary cam and a fourth sliding cam facing the fourth rotary cam, and an elastic member disposed between the first sliding part and the second sliding part.

The first arm, the second arm, the third arm, and the fourth arm may be disposed between the first fixing member and the second fixing member in the direction of the rotation axis.

The first sliding part and the second sliding part may be disposed between the first and second arms and the third and fourth arms in the direction of the rotation axis.

The first sliding part and the second sliding part may linearly move towards or away from each other in response to rotations of the first arm, the second arm, the third arm, and the fourth arm. The elastic member may be compressed or stretched in response to linear movements of the first sliding part and the second sliding part.

The elastic member may include a first elastic member disposed between the first sliding cam and the third sliding cam, a second elastic member disposed between the second sliding cam and the fourth sliding cam, and a third elastic member disposed between the first elastic member and the second elastic member.

An end of each of the first elastic member, the second elastic member, and the third elastic member may be supported by the first sliding part, and another end of each of the first elastic member, the second elastic member, and the third elastic member may be supported by the second sliding part.

The hinge may further include a pin coupled to the first sliding part and the second sliding part. The first elastic member may surround the first shaft, the second elastic member may surround the second shaft, and the third elastic member may surround the pin.

The hinge may further include a first bracket connecting the first arm and the third arm, and a second bracket connecting the second arm and the fourth arm.

The hinge may further include a first connection gear and a second connection gear that are disposed between the first arm and the second arm and engage with each other, and a third connection gear and a fourth connection gear that are disposed between the third arm and the fourth arm and engage with each other. The first arm, the second arm, the third arm, and the fourth arm may include gears respectively engaging with the first connection gear, the second connection gear, the third connection gear, and the fourth connection gear.

The second arm and the fourth arm may rotate counterclockwise around the second shaft in case that the first arm and the third arm rotate clockwise around the first shaft, by engagement between the gears of the first arm, the second arm, the third arm, and the fourth arm, and the first connection gear, the second connection gear, the third connection gear, and the fourth connection gear.

According to the embodiments, it is possible to provide the hinge and the foldable display device including the same capable of smoothly performing the operation of folding and unfolding the foldable display device. Particularly, an embodiment may increase a torque that is provided by a hinge.

The increased torque provided by the hinge may provide the display device that maintains a predetermined or selected unfolding or folding angle of the display device and has a detent function depending on the unfolding or folding angle and a free stop function that provides an arbitrary state between an unfolded state and a fully folded state of the display device.

According to embodiments, there is an advantageous effect that is recognized throughout the specification.

DETAILED DESCRIPTION OF THE EMBODIMENTS

Figure 1:
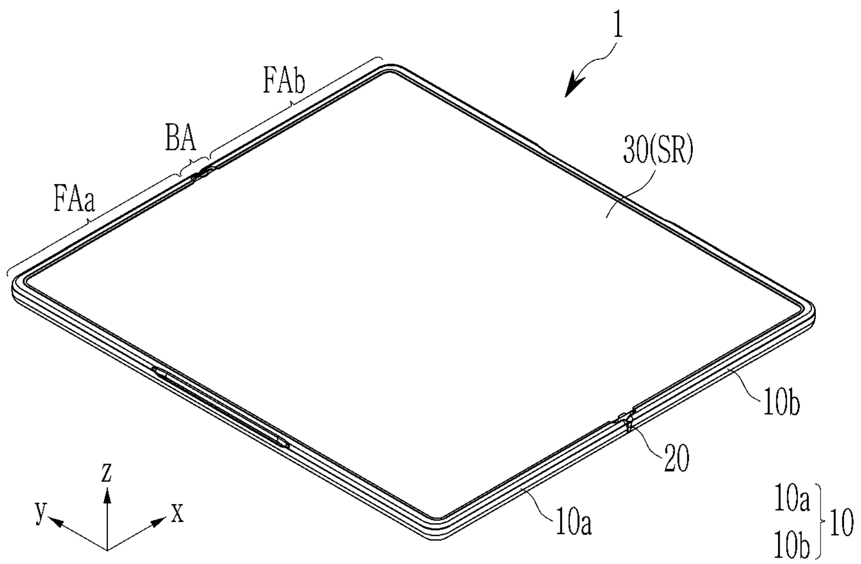
FIG. 1 is a schematic perspective view showing an unfolded state of a foldable display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The size and thickness of each component shown in the drawing may be arbitrarily indicated for better understanding and ease of description.

When a part of a layer, film, region, plate, and the like is described as being "on" or "above" another part, it includes not only the case where it is "directly on" another component, but also the case where there may be another component in between. When a component is described as being "directly above" another, it means that there may be no other components in between.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Throughout the specification, “connected” does not mean only when two or more constituent elements are directly connected, but may also include a case that two or more constituent elements are indirectly connected through other constituent elements, a case that they are physically connected, a case of being electrically connected, and a case in which each part that is substantially integral with each other while being referred to by a different name depending on a position or function.

In the drawings, the signs “x”, “y”, and “z” are used to indicate directions, where “x” may be a first direction, “y” may be a second direction that is perpendicular to the first direction, and “z” may be a third direction that is perpendicular to the first direction and the second direction.

As used herein, the singular forms, “a,” “an,” and “the” are intended to include the plural forms as well, unless the context clearly indicates otherwise.

In the specification and the claims, the term “and/or” is intended to include any combination of the terms “and” and “or” for the purpose of its meaning and interpretation. For example, “A and/or B” may be understood to mean any combination including “A, B, or A and B.” The terms “and” and “or” may be used in the conjunctive or disjunctive sense and may be understood to be equivalent to “and/or.”

In the specification and the claims, the phrase “at least one of” is intended to include the meaning of “at least one selected from the group of” for the purpose of its meaning and interpretation. For example, “at least one of A and B” may be understood to mean any combination including “A, B, or A and B.”

The terms “face” and “facing” mean that a first element may directly or indirectly oppose a second element. In a case in which a third element intervenes between the first and second element, the first and second element may be understood as being indirectly opposed to one another, although still facing each other.

“About” or “approximately” or “substantially” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
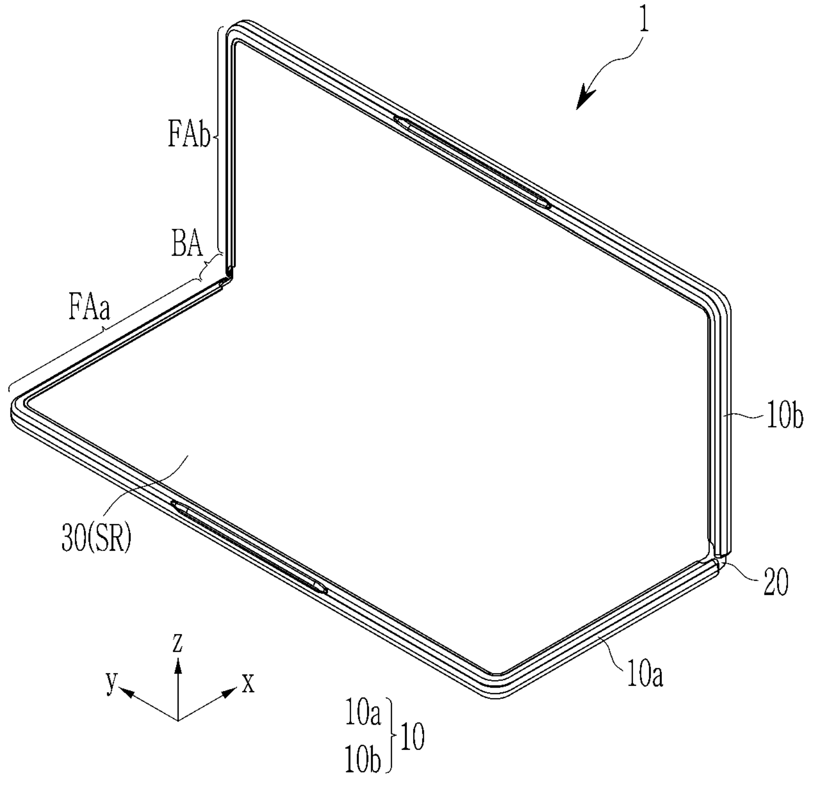
FIG. 2 is a schematic perspective view showing a partially unfolded state of the foldable display device according to an embodiment.
Figure 3:
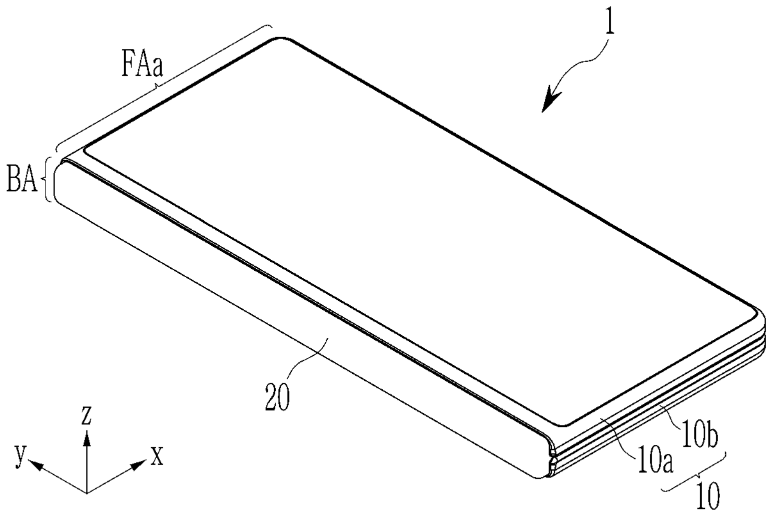
FIG. 3 is a schematic perspective view showing a folded state of the foldable display device according to an embodiment.

FIG. 1 is a schematic perspective view showing an unfolded state of a foldable display device according to an embodiment. FIG. 2 is a schematic perspective view showing a partially unfolded state of the foldable display device according to an embodiment. FIG. 3 is a schematic perspective view showing a folded state of the foldable display device according to an embodiment.

The foldable display device 1 (hereinafter also simply referred to as a display device) may be an electronic device that includes a main function of displaying an image. The display device 1 may be implemented as, e.g., an electronic device such as a smart phone, a mobile phone, a tablet, a multimedia player, a game console, or a monitor, or may be applied to such an electronic device.

As illustrated in FIG. 1, the display device 1 may be generally flatly unfolded. The display device 1 may include a first flat area FAa, a second flat area FAb, and a bendable area BA between the first flat area FAa and the second flat area FAb. The bendable area BA may be an area that is bent in case that the display device 1 is folded, and the first flat area FAa and the second flat area FAb may be areas that are not bent in case that the display device 1 is folded. The bendable area BA may be bent around an axis that is parallel to the second direction y.

Although one bendable area BA is illustrated, the display device 1 may include multiple bendable areas BA that are spaced apart from each other, may be bent with different radii of curvature, or may be bent around different bending axes. Although the bendable area BA is illustrated to be positioned at an approximately center of the display device 1, the position and width of the bendable area BA of the display device 1 may be changed in embodiments.

The display device 1 may include a body 10. The body 10 may be referred to as a set, a set frame, or a housing. The body 10 may form an overall appearance of the display device 1, and various components constituting the display device 1, such as a processor, a memory, a driving device, a printed circuit board, a battery, a communication module, a speaker, various sensors, and the like, may be accommodated in the body 10. The body 10 may include a first body **10*a* corresponding to the first flat area FAa and a second body 10*b* corresponding to the second flat area FAb. The first body 10*a* and the second body 10*b*** may form a pair with each other.

The display device 1 may include a hinge unit 20. The hinge unit 20 may be connected to the body 10. The hinge unit 20 may be connected to the first body **10*a* and the second body 10*b* to allow the display device 1 to be folded and unfolded. In case that the display device 1 is unfolded, the first body 10*a* and the second body 10*b* may be disposed in parallel as shown in FIG. 1. In case that the display device 1 is folded, the first body 10*a* and the second body 10*b* may face each other as shown in FIG. 3. In case that the display device 1 is partially unfolded or folded as shown in FIG. 2, the first body 10*a* and the second body 10*b* may be maintained at a predetermined or selected angle. The hinge unit 20 may serve as a rotation axis of the bendable area BA, and may allow the bendable area BA to be bent. Accordingly, the display device 1 may generally change shape between folding and unfolding. The display device 1** may be maintained in a partially folded state or in a partially unfolded state.

The display device 1 may include a display panel 30 which includes a screen SR on which an image is displayed. The screen SR may correspond to a display area in which pixels are arranged in the display panel 30. The bendable area BA may be positioned across the screen SR in the second direction y. In the display panel 30, an area corresponding to the bendable area BA may be flexible. The display panel 30 may be attached to the body 10, and as the display device 1 is unfolded and folded, the display panel 30 may be unfolded and folded.

As shown in FIG. 3, the display device 1 may be folded so that portions of the screen SR face each other, i.e., a screen portion of the first flat area FAa and a screen portion of the second flat area FAb face each other. In a folded state, the screen portion of the bendable area BA may be covered. In case that the first flat area FAa and the second flat area FAb are substantially the same, the entire screen SR may be covered by the body 10 of the display device 1 in the folded state.

Figure 4:
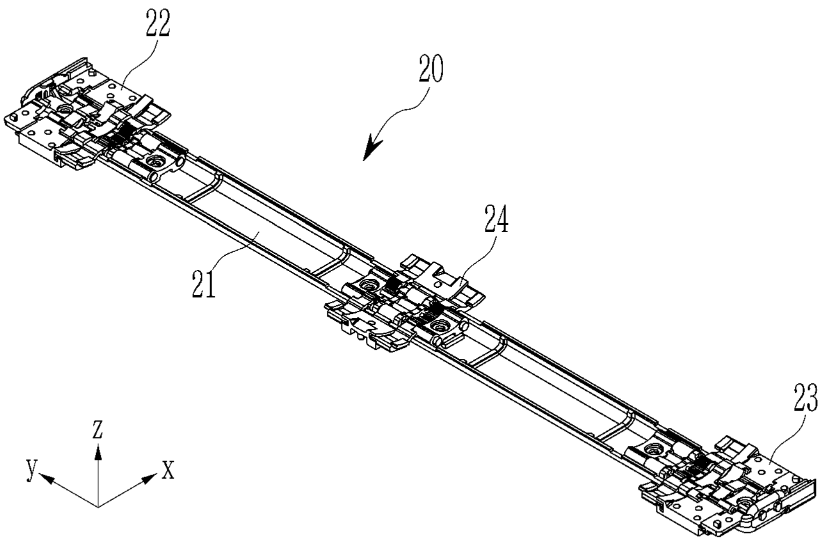
FIG. 4 is a schematic perspective view showing a hinge unit in the foldable display device according to an embodiment.

FIG. 4 is a schematic perspective view showing the hinge unit in the foldable display device according to an embodiment.

Referring to FIG. 4, the hinge unit 20 may connect the first body 10*a* and the second body 10*b* so that the first body 10*a* and the second body 10*b* rotate around their respective rotation axes. The hinge unit 20 may include a hinge housing 21 and hinges 22, 23, and 24. The hinge housing 21 may be positioned long along the second direction y parallel to an axis direction of the display device 1. Each of the hinges 22, 23, and 24 may be coupled to the hinge housing 21 by a fastening means such as a screw. Each of the hinges 22, 23, and 24 may be coupled to the first body 10*a* and the second body 10*b*.

The hinges 22, 23, and 24 may include the hinge 22 positioned at a side of the hinge housing 21, the hinge 23 positioned another side of the hinge housing 21, and the hinge 24 positioned at an approximately center of the hinge housing 21. The hinges 22, 23, and 24 may have the same, similar, or different structures. For example, the hinges 22 and 23 may have the same or similar structures to each other, and the hinge 24 may have a different structure from the hinges 22 and 23. The hinge 24 may be provided to provide a torque acting on a rotation structure. Although three hinges 22, 23, and 24 are shown in the drawing, the hinge unit 20 may include fewer or more hinges than the three hinges.

Figure 5:
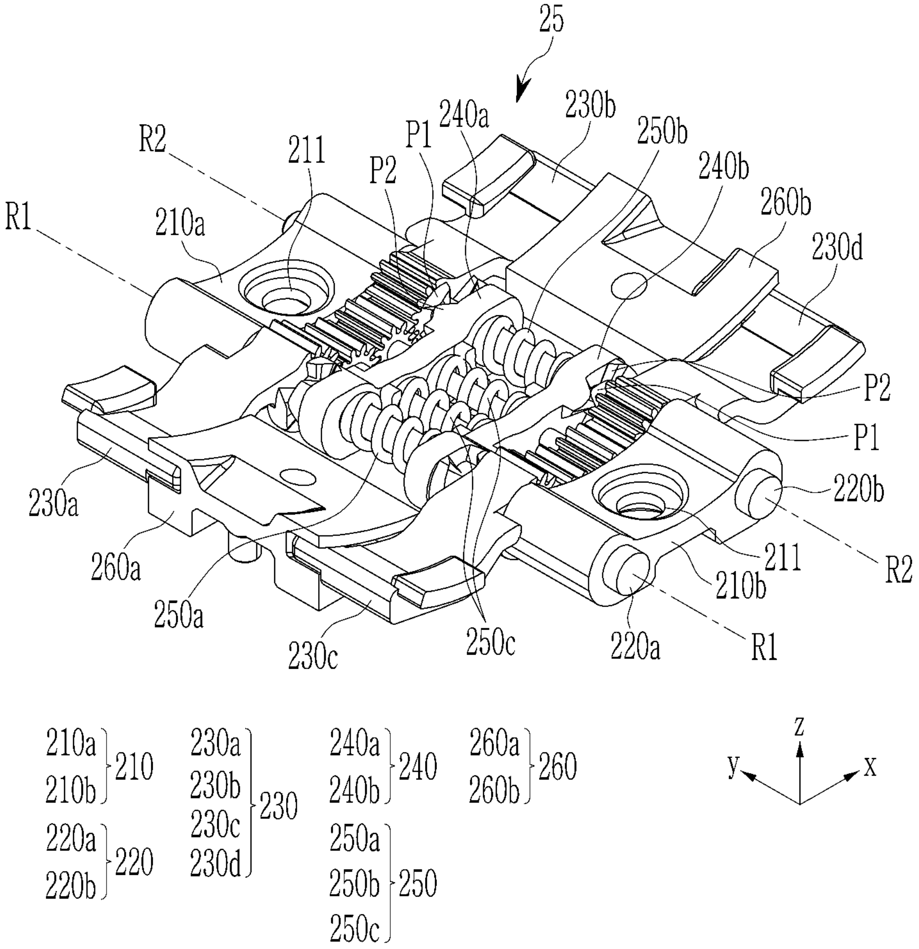
FIG. 5 is a schematic perspective view of a hinge according to an embodiment.
Figure 6:
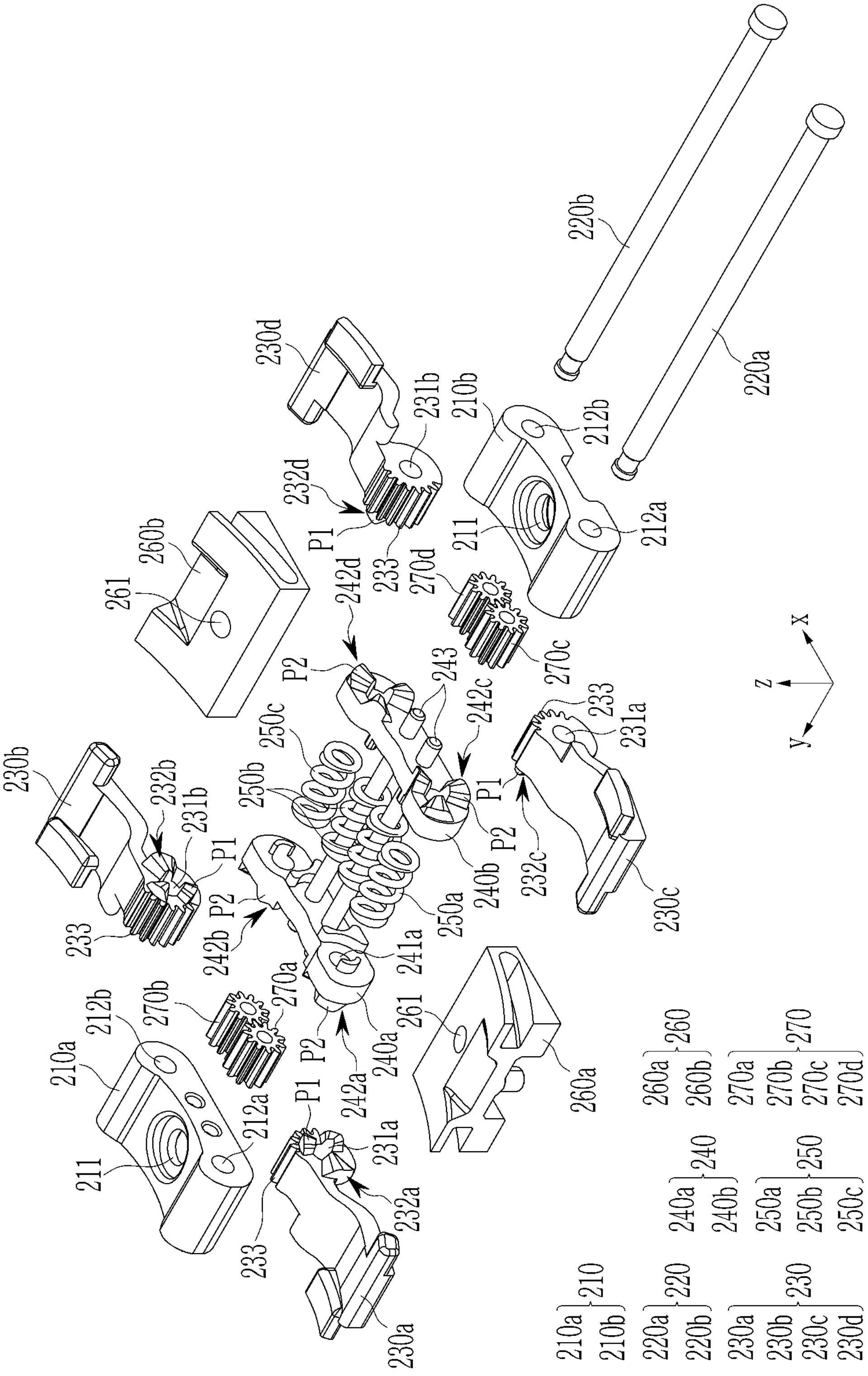
FIG. 6 is an exploded schematic perspective view of the hinge shown in FIG. 5.
Figure 7:
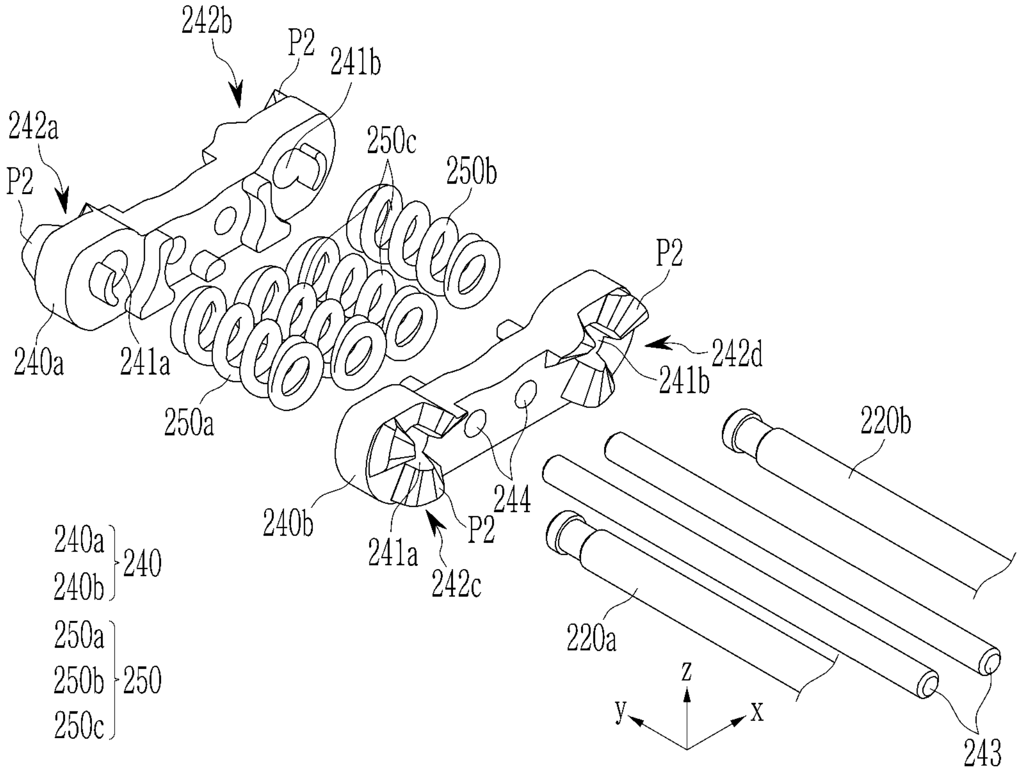
FIG. 7 is a partially enlarged schematic view of a sliding part and an elastic member in the hinge shown in FIG. 6.
Figure 8:
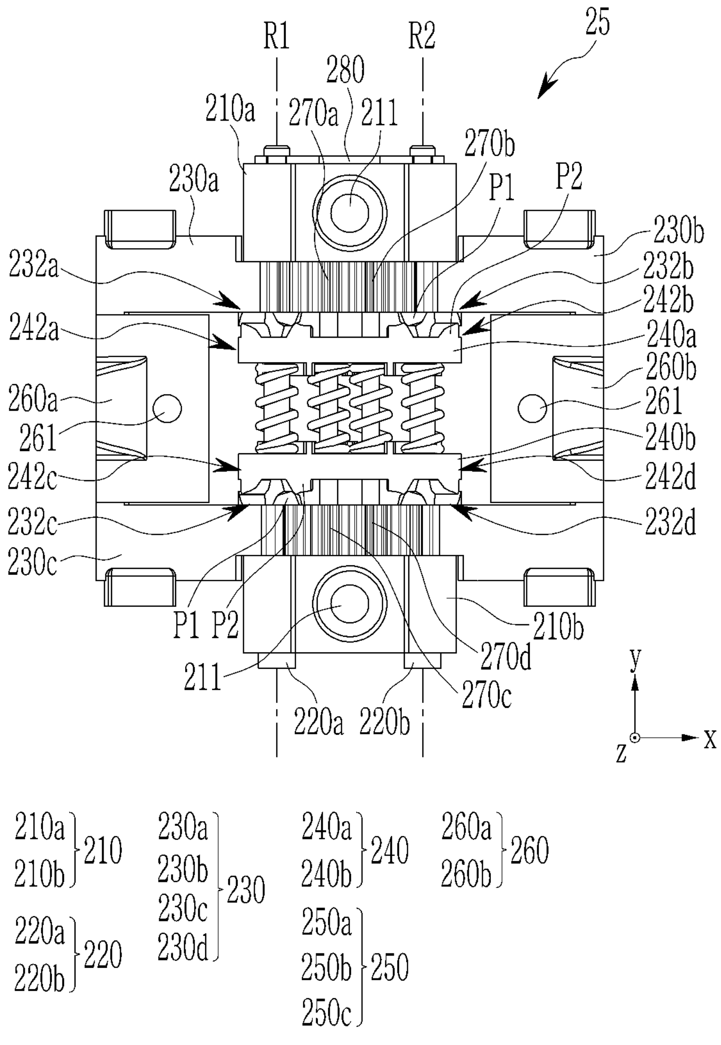
FIG. 8 is a schematic front view of the hinge shown in FIG. 5.
Figure 9:
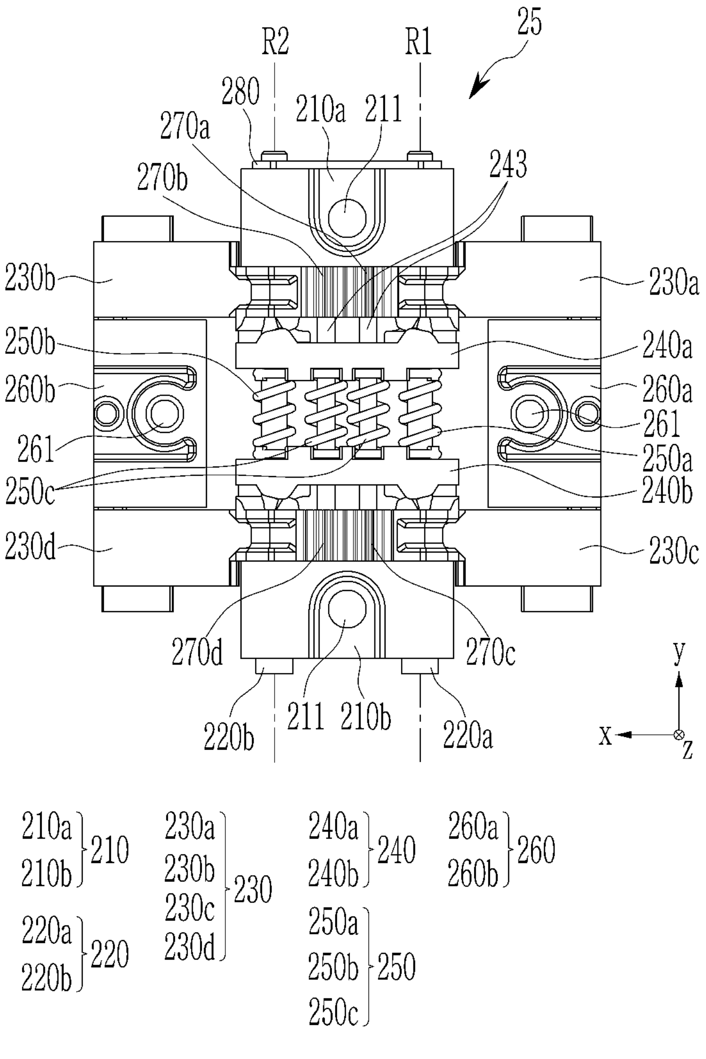
FIG. 9 is a schematic rear view of the hinge shown in FIG. 5.
Figure 10:
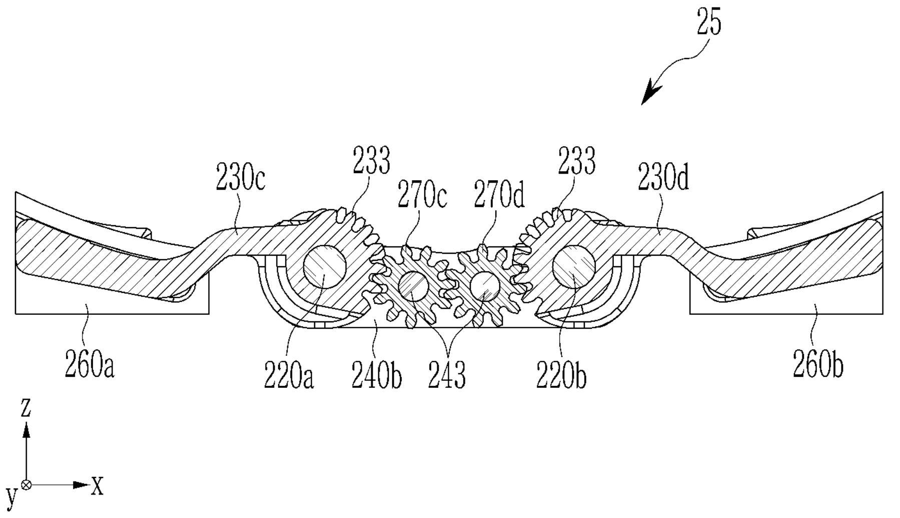
FIG. 10 and FIG. 11 are schematic cross-sectional views showing linkage between an arm and a connection gear in the hinge according to an embodiment.
Figure 11:
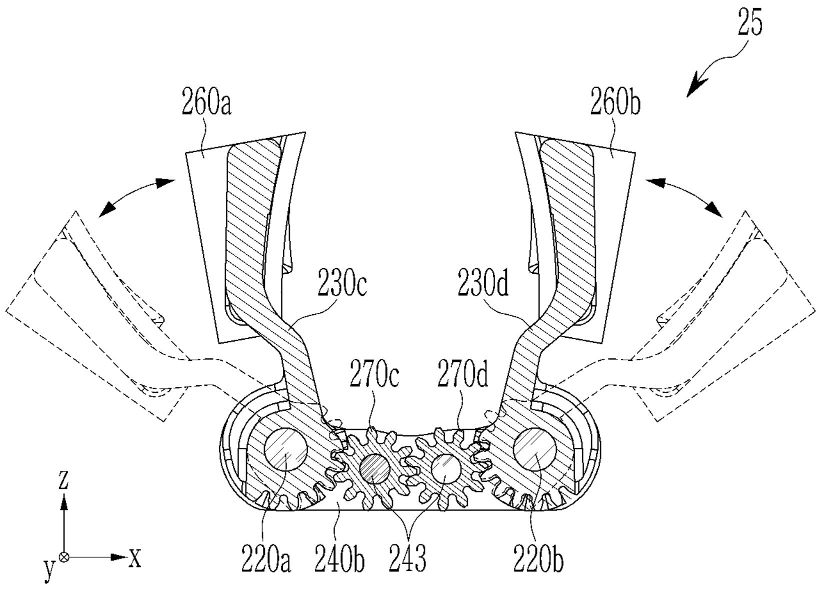

FIG. 5 is a schematic perspective view of a hinge according to an embodiment. FIG. 6 is an exploded schematic perspective view of the hinge shown in FIG. 5. FIG. 7 is a partially enlarged schematic view of a sliding part and an elastic member in the hinge shown in FIG. 6. FIG. 8 is a schematic front view of the hinge shown in FIG. 5. FIG. 9 is a schematic rear view of the hinge shown in FIG. 5. FIG. 10 and FIG. 11 are schematic cross-sectional views showing linkage between an arm and a connection gear in the hinge according to an embodiment.

A hinge 25 shown in FIG. 5 through FIG. 11 may be one of the hinges 22, 23, and 24 shown in FIG. 4. For example, the hinge 25 may be the hinge 24 positioned at the approximately center of the hinge housing 21.

The hinge 25 may include a fixing member 210, a shaft 220, an arm 230, a sliding part 240, an elastic member 250, a bracket 260, a connection gear 270, and the like.

The fixing member 210 may include a first fixing member 210*a* and a second fixing member 210*b* spaced apart in the second direction y. Each of the first fixing member 210*a* and the second fixing member 210*b* may include a hole 211 into which a fastening means such as a screw is inserted to couple the first fixing member 210*a* and the second fixing member 210*b* to the hinge housing 21. The hole 211 may be formed to penetrate the first fixing member 210*a* and the second fixing member 210*b* in the third direction z. Each of the first fixing member 210*a* and the second fixing member 210*b* may include a penetration hole 212*a* and a penetration hole 212*b* into which the shaft 220 is inserted and coupled. The penetration hole 212*a* and the penetration hole 212*b* may be formed to pass through the first fixing member 210*a* and the second fixing member 210*b* in the second direction y.

Each of the first fixing member 210*a* and the second fixing member 210*b* may be substantially rectangular in plan view. Unlike the drawing, each of the first fixing member 210*a* and the second fixing member 210*b* may have various shapes such as an approximate T-shape. The first fixing member 210*a* and the second fixing member 210*b* may have substantially the same structure, but may have different structures.

The shaft 220 may include a first shaft 220*a* coaxial with a first rotation axis R1 and a second shaft 220*b* coaxial with a second rotation axis R2. The first rotation axis R1 and the second rotation axis R2 may be parallel to the axis direction of the display device.

The first shaft 220*a* may be inserted into the penetration hole 212*a* of the first fixing member 210*a* and the penetration hole 212*a* of the second fixing member 210*b*, and the second shaft 220*b* may be inserted into the penetration hole 212*b* of the first fixing member 210*a* and the penetration hole 212*b* of the second fixing member 210*b*. The first shaft 220*a* and the second shaft 220*b* may have the same length. An end of the first shaft 220*a* and an end of the second shaft 220*b* may have a larger diameter or width than the penetration holes 212*a* and 212*b* of the second fixing member 210*b*, and another end of the first shaft 220*a* and another end of the second shaft 220*b* passing through the penetration holes 212*a* and 212*b* of the first fixing member 210*a* are coupled to a fixing ring 280 so that it is possible to prevent the first shaft 220*a* and the second shaft 220*b* from being separated.

The arm 230 may include a first arm 230*a* and a third arm 230*c* coupled to the first shaft 220*a* so as to be rotatable about the first shaft 220*a*, and a second arm 230*b* and a fourth arm 230*d* rotatably coupled to the second shaft 220*b* to be rotatable about the second shaft 220*b*.

The first arm 230*a* and the third arm 230*c* may be spaced apart in the second direction y, and the second arm 230*b* and the fourth arm 230*d* may be spaced apart in the second direction y. The first arm 230*a* and the second arm 230*b* may be spaced apart in the first direction x. The third arm 230*c* and the fourth arm 230*d* may be spaced apart in the first direction x. The first arm 230*a* and the third arm 230*c* may be symmetrical with respect to the first direction x, and the second arm 230*b* and the fourth arm 230*d* may be symmetrical with respect to the first direction x. The first arm 230*a* and the second arm 230*b* may be symmetric with respect to the second direction y, and the third arm 230*c* and the fourth arm 230*d* may be symmetric with respect to the second direction y.

The first arm 230*a* and the third arm 230*c* may include a through hole 231*a* into which the first shaft 220*a* is inserted and coupled, and the second arm 230*b* and the fourth arm 230*d* may include a through hole 231*b* into which the second shaft 220*b* is inserted and coupled. Rotation of the first arm 230*a* and the third arm 230*c* may be supported by the first fixing member 210*a* through the first shaft 220*a*. Rotation of the second arm 230*b* and the fourth arm 230*d* may be supported by the second fixing member 210*b* through the second shaft 220*b*.

The first arm 230*a* may include a first rotary cam 232*a*, the second arm 230*b* may include a second rotary cam 232*b*, the third arm 230*c* may include a third rotary cam 232*c*, and the fourth arm 230*d* may include a fourth rotary cam 232*d*. The first rotary cam 232*a* and the third rotary cam 232*c* may rotate around the first shaft 220*a*, and the second rotary cam 232*b* and the fourth rotary cam 232*d* may rotate around the second shaft 220*b*. The first, second, third, and fourth rotary cams 232*a*, 232*b*, 232*c*, and 232*d* may rotate together at the same angle in case that the first, second, third, and fourth arm 230*a*, 230*b*, 230*c*, and 230*d* are rotated. The first and third rotary cams 232*a* and 232*c* may be disposed to face each other, and the second and fourth rotary cams 232*b* and 232*d* may be disposed to face each other.

Each of the first, second, third, and fourth rotary cams 232*a*, 232*b*, 232*c*, and 232*d* may include a protrusion P1 formed around the through-hole 231*a* or 231*b*. Although a structure in which each of the first, second, third, and fourth rotary cams 232*a*, 232*b*, 232*c*, and 232*d* includes three protrusions P1 is shown in the drawing, each of the first, second, third, and fourth rotary cams may include fewer or more protrusions P1 than the three protrusions.

Each of the first, second, third, and fourth arms 230*a*, 230*b*, 230*c*, and 230*d* may include a gear 233 provided on an external circumferential surface. The gear 233 may be formed on a circular arc surface centered on the first rotation axis R1 or on a circular arc surface centered on the second rotation axis R2.

The sliding part 240 may include a first sliding part 240*a* adjacent to the first and second arms 230*a* and 230*b*, and a second sliding part 240*b* adjacent to the third and fourth arms 230*c* and 230*d*.

The first and second sliding parts 240*a* and 240*b* may be movably coupled to the first and second shafts 220*a* and 220*b*. Each of the first and second sliding parts 240*a* and 240*b* may include a through hole 241*a* into which the first shaft 220*a* is inserted and coupled, and a through hole 241*b* into which the second shaft 220*b* is inserted and coupled. The first and second sliding parts 240*a* and 240*b* may have the same shape and size as each other. When viewed in the second direction y, each of the first and second sliding parts 240*a* and 240*b* may have a planar shape such as an approximate dumbbell shape, an approximate oval shape, or the like.

The first sliding part 240*a* may include first and second sliding cams 242*a* and 242*b*, and the second sliding part 240*b* may include third and fourth sliding cams 242*c* and 242*d*. The first and second sliding parts 240*a* and 240*b* may be disposed so that the first and third sliding cams 242*a* and 242*c* face opposite directions and the second and fourth sliding cams 242*b* and 242*d* face opposite directions. Each of the first, second, third, and fourth sliding cams 242*a*, 242*b*, 242*c*, and 242*d* may include a protrusion P2 formed around the through hole 241*a* or 241*b*. Although a structure in which each of the first, second, third, and fourth sliding cams 242*a*, 242*b*, 242*c*, and 242*d* includes three protrusions P2 is shown in the drawing, each of the first, second, third, and fourth sliding cams may include fewer or more protrusions P2 than the three protrusions.

The first sliding cam 242*a* may face the first rotary cam 232*a* and may engage with the first rotary cam 232*a*, the second sliding cam 242*b* may face the second rotary cam 232*b* and may engage with the second rotary cam 232*b*, the third sliding cam 242*c* may face the third rotary cam 232*c* and may engage with the third rotary cam 232*c*, and the fourth sliding cam 242*d* may face the fourth rotary cam 232*d* and may engage with the fourth rotary cam 232*d*. The first and second sliding parts 240*a* and 240*b* may linearly move in a direction close to each other or in a direction away from each other along the second direction y by an interaction of the first, second, third, and fourth sliding cams 242*a*, 242*b*, 242*c*, and 242*d* and the first, second, third, and fourth rotary cams 232*a*, 232*b*, 232*c*, and 232*d* in case that the first, second, third, and fourth arms 230*a*, 230*b*, 230*c*, and 230*d* rotate around the first and second shafts 220*a* and 220*b*. Both the first and second sliding parts 240*a* and 240*b* may linearly move along the first and second shafts 220*a* and 220*b*.

The elastic member 250 may be positioned between the first and second sliding parts 240*a* and 240*b*. The elastic member 250 may include a first elastic member 250*a* positioned between the first and third sliding cams 242*a* and 242*c*, a second elastic member 250*b* positioned between the second and fourth sliding cams 242*b* and 242*d*, and a third elastic member 250*c* positioned between the first and second elastic members 250*a* and 250*b*.

An end of each of the first, second, and third elastic members 250*a*, 250*b*, and 250*c* may be in contact with the first sliding part 240*a*, and another end of each of the first, second, and third elastic members 250*a*, 250*b*, and 250*c* may be in contact with the second sliding part 240*b*. The first and second elastic members 250*a* and 250*b* may include a spring structure. An end of each of the first, second, and third elastic members 250*a*, 250*b*, and 250*c* may be supported by the first sliding part 240*a* and another end of each of the first, second, and third elastic members 250*a*, 250*b*, and 250*c* may be supported by the second sliding part 240*b*. The first elastic member 250*a* may surround the first shaft 220*a*, and the second elastic member 250*b* may surround the second shaft 220*b*. The third elastic member 250*c* may be positioned between the first and second elastic members 250*a* and 250*b*. The third elastic member 250*c* may include a spring structure.

The hinge 25 may include a fixing structure that allows both ends of the third elastic member 250*c* to be restrained in an axial direction without being separated. For example, the fixing structure may include a pin 243 around which the third elastic member 250*c* is wound. The pin 243 may be inserted and coupled into a hole 244 or a groove formed in the first and second sliding parts 240*a* and 240*b*. The first and second sliding parts 240*a* and 240*b* may include a groove into which an edge of the third elastic member 250*c* is inserted or a protrusion into which the edge of the third elastic member 250*c* is inserted as the fixing structure. The pin 243 may be provided for each third elastic member 250*c*. Although two third elastic members 250*c* are shown in the drawing, the elastic member 250 may include fewer or more third elastic members than the two third elastic members.

The first elastic member 250*a* may be compressed or stretched (or restored) according to a linear movement of the first and second sliding parts 240*a* and 240*b* by a rotation movement of the first and third arms 230*a* and 230*c*. For example, in case that the first and second sliding parts 240*a* and 240*b* move in a direction close to each other, the first elastic member 250*a* may be compressed, and the compressed first elastic member 250*a* may pressurize the second sliding parts 240*a* and 240*b* by an elastic force. Accordingly, a frictional force between the first and third sliding cams 242*a* and 242*c* and the first and third rotary cams 232*a* and 232*c* may increase, and a torque acting on the first and third arms 230*a* and 230*c* may increase due to the increased frictional force.

The second elastic member 250*b* may be compressed or stretched according to a linear movement of the first and second sliding parts 240*a* and 240*b* due to a rotation movement of the second and fourth arms 230*b* and 230*d*. For example, in case that the first and second sliding parts 240*a* and 240*b* move in a direction close to each other, the second elastic member 250*b* may be compressed, and the compressed second elastic member 250*b* may pressurize the second sliding parts 240*a* and 240*b* by an elastic force. Accordingly, a frictional force between the second and fourth sliding cams 242*b* and 242*d* and the second and fourth rotary cams 232*b* and 232*d* may increase, and a torque acting on the second and fourth arms 230*b* and 230*d* may increase due to the increased frictional force.

The third elastic member 250*c* may be compressed or stretched according to a linear movement of the first and second sliding parts 240*a* and 240*b* by a rotation movement of the first, second, third, and fourth arms 230*a*, 230*b*, 230*c*, and 230*d*. For example, in case that the first and second sliding parts 240*a* and 240*b* move in a direction close to each other, the third elastic member 250*c* may be compressed, and the compressed third elastic member 250*c* may pressurize the first and second sliding parts 240*a* by an elastic force. Accordingly, a frictional force between the sliding cams 242*a*, 242*b*, 242*c*, and 242*d* and the rotary cams 232*a*, 232*b*, 232*c*, and 232*d* may increase, and a torque acting on the first, second, third, and fourth arms 230*a*, 230*b*, 230*c*, and 230*d* may increase due to the increased frictional force.

Since the first sliding part 240*a* and the second sliding part 240*b* are disposed at a side and another side of the elastic member 250, the elastic member 250 may be compressed by the first and second sliding parts 240*a* and 240*b* linearly moving in both directions. Accordingly, in case that the first, second, third, and fourth arms 230*a*, 230*b*, 230*c*, and 230*d* are rotated at a predetermined or selected rotation angle, the elastic member 250 may be compressed approximately twice as much as in a case that the sliding part is disposed at only one side of the elastic member 250. Since an elastic force may increase in proportion to an increased amount of compression, a frictional force between the first, second, third, and fourth sliding cams 242*a*, 242*b*, 242*c*, and 242*d* and the first, second, third, and fourth rotary cams 232*a*, 232*b*, 232*c*, and 232*d* that is generated by pressurizing the first and second sliding parts 240*a* and 240*b* may increase. Accordingly, a torque acting on the first, second, third, and fourth arms 230*a*, 230*b*, 230*c*, and 230*d* may further increase due to the increased frictional force.

Elastic forces of the first and second elastic members 250*a* and 250*b* may be equal to each other so that the first and second sliding parts 240*a* and 240*b* move along the second direction y parallel to the first direction x. To increase a torque, an elastic force of the third elastic member 250*c* may be greater than elastic forces of the first and second elastic members 250*a* and 250*b*. The elastic force of the third elastic member 250*c* may be equal to or less than the elastic forces of the first and second elastic members 250*a* and 250*b*.

The bracket 260 may include a first bracket 260*a* connected to the first and third arms 230*a* and 230*c*, and a second bracket 260*b* connected to the second and fourth arms 230*b* and 230*d*. The first and third arms 230*a* and 230*c* may be connected by the first bracket 260*a* so that the first and third arms are rotated at an equal angle as a single part. The second and fourth arms 230*b* and 230*d* may be connected by the second bracket 260*b* so that the second and fourth arms are rotated at an equal angle as a single part. Each of the first and second brackets 260*a* and 260*b* may include a hole 261 into which a fastening means such as a screw is inserted in order to couple the first and second brackets to the first and second bodies 10*a* and 10*b*. The hinge 25 may be coupled to the first and second bodies 10*a* and 10*b* through the first and second brackets 260*a* and 260*b*, but may also be coupled through a different structure.

The connection gear 270 may include a first connection gear 270*a*, a second connection gear 270*b*, a third connection gear 270*c*, and a fourth connection gear 270*d*. The first, second, third, and fourth connecting gears 270*a*, 270*b*, 270*c*, and 270*d* may be rotatably coupled to the pin 243 around which the third elastic member 250*c* is wound so that the first, second, third, and fourth connection gears 270*a*, 270*b*, 270*c*, and 270*d* are not separated and are restrained in an axial direction. For example, the pin 243 around which the third elastic member 250*c* is wound may penetrate holes formed in the first and second sliding parts 240*a* and 240*b*, and the first, second, third, and fourth connection gears 270*a*, 270*b*, 270*c*, and 270*d* may be rotatably coupled to a portion of the pin 243 protruding through the first and second sliding parts 240*a* and 240*b*. Unlike the drawing, the first sliding part 240*a* may include protrusions protruding toward the first and third connection gears 270*a* and 270*c*, the second sliding part 240*b* may include protrusions protruding toward the second and fourth connection gears 270*b* and 270*d*, and each of the first, second, third, and fourth connection gears 270*a*, 270*b*, 270*c*, and 270*d* may be rotatably coupled to a corresponding protrusion.

The first and second connection gears 270*a* and 270*b* may be positioned between the first and second arms 230*a* and 230*b*, and may engage with each other. The first and second connection gears 270*a* and 270*b* may rotate in opposite directions to each other. The first connection gear 270*a* may engage with the gear 233 of the first arm 230*a*, and the second connection gear 270*b* may engage with the gear 233 of the second arm 230*b*. The first connection gear 270*a* and the gear 233 of the first arm 230*a* may rotate in opposite directions to each other, and the second connection gear 270*b* and the gear 233 of the second arm 230*b* may rotate in opposite directions to each other. The third and fourth connection gears 270*c* and 270*d* may be positioned between the third and fourth arms 230*c* and 230*d*, and may engage with each other. The third and fourth connection gears 270*c* and 270*d* may rotate in opposite directions to each other. The third connection gear 270*c* may engage with the gear 233 of the third arm 230*c*, and the fourth connection gear 270*d* may engage with the gear 233 of the fourth arm 230*d*. The third connection gear 270*c* and the gear 233 of the third arm 230*c* may rotate in opposite directions to each other, and the fourth connection gear 270*d* and the gear 233 of the fourth arm 230*d* may rotate in opposite directions to each other.

Referring to FIGS. 10 and 11, the second and fourth arms 230*b* and 230*d* may rotate around the second shaft 220*b* by the engagement structure in case that the first and third arms 230*a* and 230*c* rotate around the first shaft 220*a*. Conversely, in case that the second and fourth arms 230*b* and 230*d* rotate around the second shaft 220*b*, the first and third arms 230*a* and 230*c* may rotate around the first shaft 220*a*. Due to the engagement structure, the first and third arms 230*a* and 230*c* and the second and fourth arms 230*b* and 230*d* may be interlocked to rotate in opposite directions to each other at the same angle. For example, in case that the first and third arms 230*a* and 230*c* rotate clockwise around the first shaft 220*a* at a predetermined or selected angle, the second and fourth arms 230*b* and 230*d* may rotate counterclockwise around the second shaft 220*b* at the same angle as the predetermined or selected angle.

Figure 12:
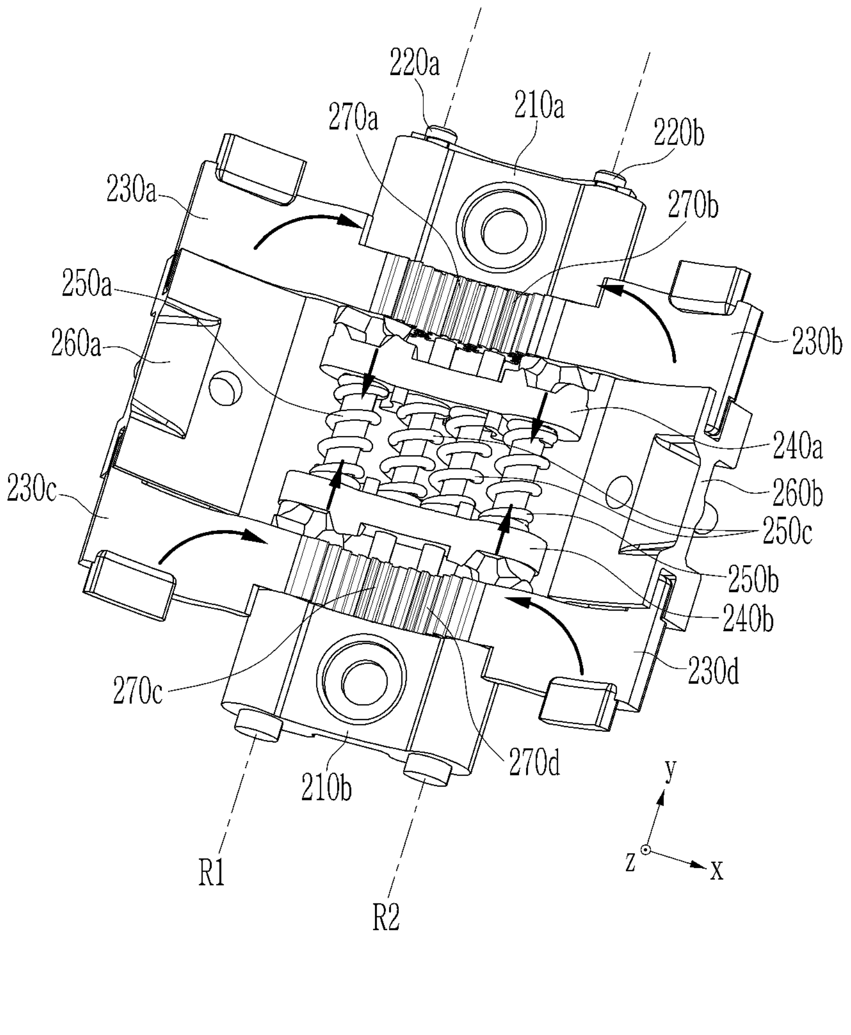
FIG. 12 is a schematic view showing a rotation operation in the hinge according to an embodiment.
Figure 13:
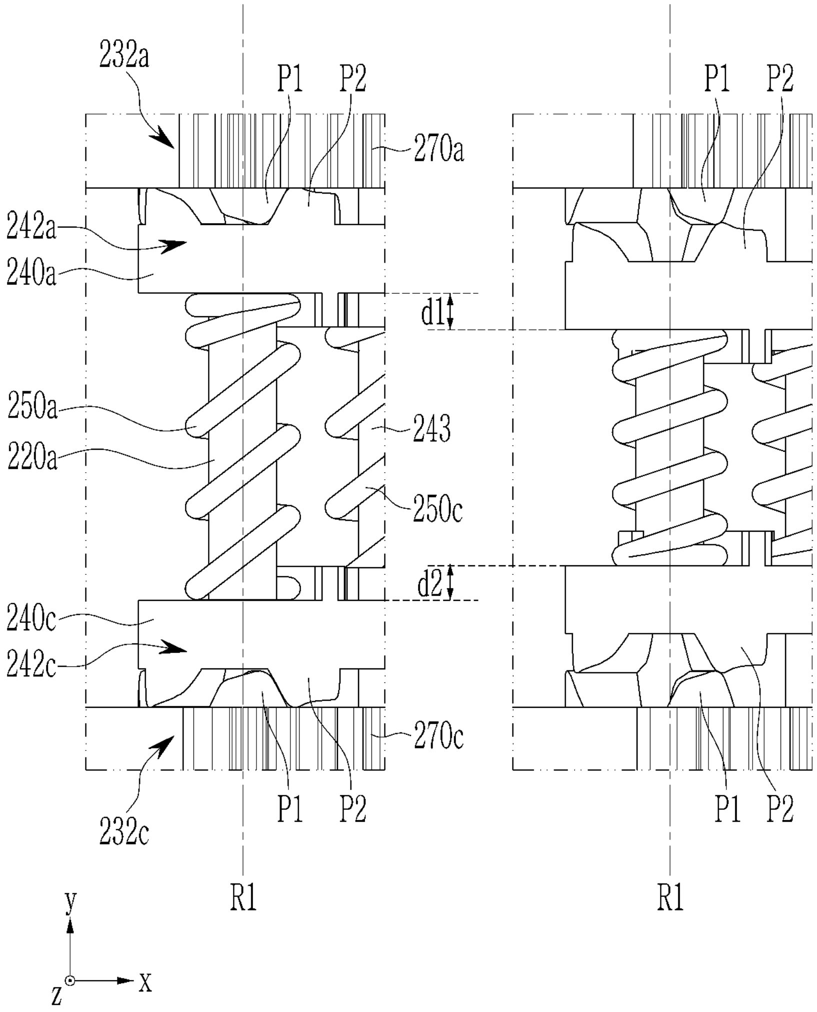
FIG. 13 is a schematic view showing a movement of the sliding part according to rotation of the arm in the hinge according to an embodiment.

FIG. 12 is a schematic view showing a rotation operation in the hinge according to an embodiment. FIG. 13 is a schematic view showing a movement of the sliding part according to rotation of the arm in the hinge according to an embodiment.

Referring to FIG. 12, in case that the display device 1 is folded, the first and third arms 230*a* and 230*c* may rotate clockwise around the first shaft 220*a*, and the second and fourth arms 230*b* and 230*d* may rotate counterclockwise around the second shaft 220*b*. Conversely, in case that the display device 1 is unfolded, the first and third arms 230*a* and 230*c* may rotate counterclockwise around the first shaft 220*a*, and the second and fourth arms 230*b* and 230*d* may rotate clockwise around the second shaft 220*b*.

In case that the first, second, third, and fourth arms 230*a*, 230*b*, 230*c*, and 230*d* rotate, the first and second sliding parts 240*a* and 240*b* may linearly move in a direction close to each other or in a direction away from each other. The first, second, and third elastic members 250*a*, 250*b*, and 250*c* may be compressed in case that the first and second sliding parts 240*a* and 240*b* move in a direction close to each other, and the first, second, and third elastic members 250*a*, 250*b*, and 250*c* may be stretched (restored) in case that the first and second sliding parts 240*a* and 240*b* move in a direction away from each other. In case that the first, second, and third elastic members 250*a*, 250*b*, and 250*c* are compressed, a torque acting on the first, second, third, and fourth arms 230*a*, 230*b*, 230*c*, and 230*d* may increase, and in case that the first, second, and third elastic members 250*a*, 250*b*, and 250*c* are stretched, a torque acting on the first, second, third, and fourth arms 230*a*, 230*b*, 230*c*, and 230*d* may decrease.

Referring to FIG. 13, an operation related to movements of the first and second sliding parts 240*a* and 240*b* in case that the first and third arms 230*a* and 230*c* are rotated is illustrated. In a left drawing of FIG. 13, the protrusions P1 of each of the first and third rotary cams 232*a* and 232*c* are disposed between the protrusions P2 of the first and third sliding cams 242*a* and 242*c* so that a first state having the largest gap between the first and second sliding parts 240*a* and 240*b* is illustrated. In a right drawing of FIG. 13, tops of the protrusions P1 of the first and third rotation cams 232*a* and 232*c* and tops of the protrusions P2 of the first and third sliding cams 242*a* and 242*c* are disposed to be aligned so that a second state having the smallest gap between the first and second sliding parts 240*a* and 240*b* is illustrated.

A change from the first state to the second state may be a result that occurs in case that the first and third rotary cams 232*a* and 232*c* rotate clockwise around the first shaft 220*a* as the first and third arms 230*a* and 230*c* rotate clockwise around the first shaft 220*a*. At this time, the first and third rotary cams 232*a* and 232*c* may be fixed in position in an axial direction, and the first and third sliding cams 242*a* and 242*c* may linearly move along the first shaft 220*a* without rotation. As a result, the first sliding cam 242*a* may be pushed by the first rotary cam 232*a* so that the first sliding cam 242*a* and the first sliding part 240*a* including the first sliding cam move toward the second sliding part 240*b*, and the third sliding cam 242*c* may be pushed by the third rotary cam 232*c* so that the third sliding cam 242*c* and the second sliding part 240*b* including the third sliding cam may move toward the first sliding part 240*a*.

As the first and second sliding parts 240*a* and 240*b* move, the first and third elastic members 250*a* and 250*c* may be compressed. For example, the first and third elastic members 250*a* and 250*c* may be compressed to correspond to a sum of a first moving distance d1 of the first sliding part 240*a* and a second moving distance d2 of the second sliding part 240*b*. The first moving distance d1 and the second moving distance d2 may be the same. Therefore, a torque provided by the elastic member 250 in a hinge may be increased by about a factor of two. In a foldable display device of a medium or large size that requires large torque, a free stop function, a detent function, and the like may be implemented without adding a hinge or increasing a hinge size very much.

An operation related to rotation of the second and fourth arms 230*b* and 230*d* may be the same as or may correspond to an operation related to rotation of the first and third arms 230*a* and 230*c* described above. For example, as described above, in case that the first and third arms 230*a* and 230*c* rotate clockwise around the first shaft 220*a*, the second and fourth arms 230*b* and 230*d* may rotate counterclockwise around the second shaft 220*b*. Accordingly, the first and second sliding parts 240*a* and 240*b* may respectively move in the first and second distances d1 and d2 toward each other and the second and third elastic members 250*b* and 250*c* may be compressed by an interaction between the second and fourth rotary cams 232*b* and 232*d* and the second and fourth sliding cams 242*b* and 242*d*. Since the second and fourth arms 230*b* and 230*d* rotate at the same time with the first and third arms 230*a* and 230*c*, the first and second sliding parts 240*a* and 240*b* may move parallel to each other without being distorted.

Figure 14:
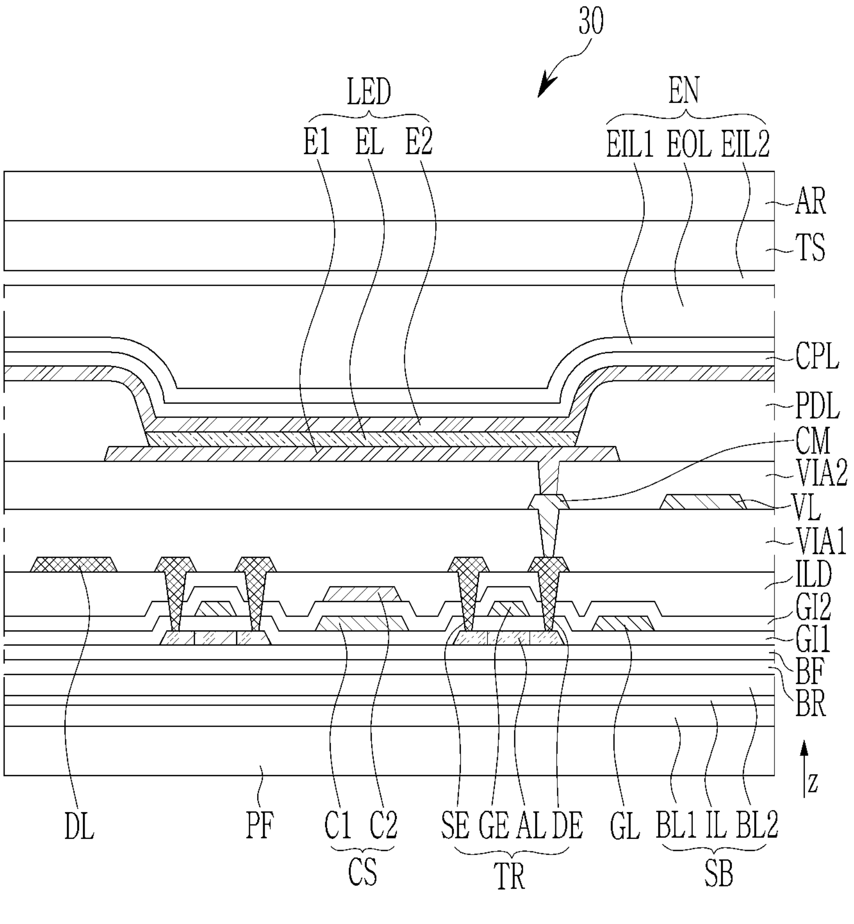
FIG. 14 is a schematic cross-sectional view schematically showing a display panel according to an embodiment.

FIG. 14 is a schematic cross-sectional view schematically showing the display panel according to an embodiment. A cross-section shown in FIG. 14 may correspond to approximately one pixel area or pixel.

Referring to FIG. 14, the display panel 30 that is included in the foldable display 1 described above may include a substrate SB, a transistor TR formed above the substrate SB, and a light emitting diode LED that is connected to the transistor TR. The light emitting diode LED may correspond to a pixel.

The substrate SB may be a flexible substrate capable of bending, folding, rolling, or the like. The substrate SB may be a multilayer (or a multiple layer) including a first base layer BL1, an inorganic layer IL, and a second base layer BL2. The first base layer BL1 or the second base layer BL2 may include a polymer resin such as a polyimide (PI), a polyamide (PA), polyethylene terephthalate (PET), or/or the like. A barrier layer BR preventing penetration of moisture, oxygen, and the like may be positioned on the substrate SB. The barrier layer BR may include an inorganic insulating material such as a silicon nitride ($SiN_x$), a silicon oxide ($SiO_x$), a silicon oxynitride ($SiO_xN_y$), and/or the like, and may be a single layer or a multilayer.

A buffer layer BF may be positioned on the barrier layer BR. The buffer layer BF may improve characteristics of a semiconductor layer by blocking impurities from the substrate SB, e.g., upon formation of the semiconductor layer, and may relieve a stress of the semiconductor layer by flattening a surface of the substrate SB. The buffer layer BF may include an inorganic insulating material such as a silicon nitride, a silicon oxide, a silicon oxynitride, and/or the like, and may be a single layer or a multilayer. The buffer layer BF may include amorphous silicon (a-Si).

The semiconductor layer AL of the transistor TR may be positioned on the buffer layer BF. The semiconductor layer AL may include a first region, a second region, and a channel region between the first region and the second region. The semiconductor layer AL may include at least one of amorphous silicon, polysilicon, and an oxide semiconductor. The oxide semiconductor may include at least one of zinc (Zn), indium (In), gallium (Ga), and tin (Sn). For example, the semiconductor layer AL may include low temperature polysilicon (LTPS) or an indium-gallium-zinc oxide (IGZO).

A first gate insulating layer GI1 may be positioned on the semiconductor layer AL.

The first gate insulating layer GI1 may include an inorganic insulating material such as a silicon nitride, a silicon oxide, a silicon oxynitride, and/or the like, and may be a single layer or a multilayer.

A first gate conductive layer that includes a gate electrode GE of the transistor TR, a gate line GL, a first electrode C1 of a storage capacitor CS, and the like may be positioned on the first gate insulating layer GI1. The first gate conductive layer may include molybdenum (Mo), aluminum (Al), copper (Cu), titanium (Ti), and/or the like, and may be a single layer or a multilayer.

A second gate insulating layer GI2 may be positioned on the first gate conductive layer. The second gate insulating layer GI2 may include an inorganic insulating material such as a silicon nitride, a silicon oxide, a silicon oxynitride, and/or the like, and may be a single layer or a multilayer.

A second gate conductive layer that includes a second electrode C2 of the storage capacitor CS and the like may be positioned on the second gate insulating layer GI2. The second gate conductive layer may include molybdenum (Mo), aluminum (Al), copper (Cu), titanium (Ti), and/or the like, and may be a single layer or a multilayer.

An interlayer insulating layer ILD may be positioned above the second gate insulating layer GI2 and the second gate conductive layer. The interlayer insulating layer ILD may include an inorganic insulating material such as a silicon nitride, a silicon oxide, a silicon oxynitride, and/or the like, and may be a single layer or a multilayer.

A first data conductive layer that includes a first electrode SE and a second electrode DE of the transistor TR, a data line DL, and the like may be positioned on the interlayer insulating layer ILD. The first electrode SE and the second electrode DE may be respectively connected to the first region and the second region of the semiconductor layer AL through contact holes of the insulating layers GI1, GI2, and ILD. One of the first electrode SE and second electrode DE may be a source electrode and the other may be a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or the like, and may be a single layer or a multilayer.

A first planarization layer VIA1 may be positioned on the first data conductive layer. The first planarization layer VIA1 may include an organic insulating material such as a general-purpose polymer such as poly(methyl methacrylate) (PMMA) or polystyrene (PS), a derivative of a polymer having a phenolic group, an acryl-based polymer, an imide-based polymer (e.g., polyimide (PI)), a siloxane-based polymer, and/or the like.

A second data conductive layer that includes a voltage line VL, a connecting member CM, and the like may be positioned on the first planarization layer VIA1. The voltage line VL may transmit a voltage such as a driving voltage, a common voltage, an initialization voltage, a reference voltage, and/or the like. The connecting member CM may be connected to the second electrode DE of the transistor TR through a contact hole of the first planarization layer VIA1. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or the like, and may be a single layer or a multilayer.

A second planarization layer VIA2 may be positioned on the second data conductive layer. The second planarization layer VIA2 may include an organic insulating material such as a general-purpose polymer such as poly(methyl methacrylate) (PMMA) or polystyrene (PS), a derivative of a polymer having a phenolic group, an acryl-based polymer, an imide-based polymer, a siloxane-based polymer, and/or the like.

A first electrode E1 of the light emitting diode LED may be positioned on the second planarization layer VIA2. The first electrode E1 may be referred to as a pixel electrode. The first electrode E1 may be connected to the connecting member CM through a contact hole of the second planarization layer VIA2. Accordingly, the first electrode E1 may be electrically connected to the second electrode DE of the transistor TR to receive a driving current for controlling luminance of the light emitting diode. The transistor TR to which the first electrode E1 is connected may be a driving transistor or a transistor electrically connected to the driving transistor. The first electrode E1 may be formed of a reflective conductive material or a semi-transmissive conductive material, or may be formed of a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), gold (Au), and/or an alloy of the metal.

A pixel defining layer PDL may be positioned on the second planarization layer VIA2 and the first electrode E1. The pixel defining layer PDL may be referred to as a bank or a partition wall, and may have an opening overlapping the first electrode E1. The pixel defining layer PDL may include an organic insulating material such as a general-purpose polymer such as poly(methyl methacrylate) (PMMA) or polystyrene (PS), a derivative of a polymer having a phenolic group, an acryl-based polymer, an imide-based polymer, a siloxane-based polymer, and/or the like.

A light emitting layer EL of the light emitting diode LED may be positioned on the first electrode E1. In addition to the light emitting layer EL, a functional layer including at least one of a hole injection layer, a hole transport layer, an electron transport layer, and an electron injection layer may be positioned on the first electrode E1.

A second electrode E2 of the light emitting diode LED may be positioned on the light emitting layer EL. The second electrode E2 may be referred to as a common electrode. The second electrode E2 may have light transmittance by forming a thin layer of a metal having a low work function such as calcium (Ca), barium (Ba), magnesium (Mg), aluminum (Al), silver (Ag), and/or the like, or by forming a thin layer of an alloy of the metal. The second electrode E2 may include a transparent conductive oxide such as an indium tin oxide (ITO) or an indium zinc oxide (IZO).

The first electrode E1, the light emitting layer EL, and the second electrode E2 of each pixel may form the light emitting diode LED such as an organic light emitting diode. The first electrode E1 may be an anode, and the second electrode E2 may be a cathode. A light emitting region of the light emitting diode LED may correspond to a pixel.

A capping layer CPL may be positioned on the second electrode E2. The capping layer CPL may improve optical efficiency by adjusting a refractive index. The capping layer CPL may be positioned to completely cover the second electrode E2. The capping layer CPL may include an organic insulating material or an inorganic insulating material.

An encapsulation layer EN may be positioned on the capping layer CPL. The encapsulation layer EN may encapsulate the light emitting diode LED to prevent penetration of moisture or oxygen from the outside. The encapsulation layer EN may be a thin film encapsulation layer in which an organic layer EOL is positioned between a first inorganic layer EIL1 and a second inorganic layer EIL2.

A touch sensor layer TS including touch electrodes may be positioned on the encapsulation layer EN. An antireflection layer AR for reducing reflection of external light may be positioned on the touch sensor layer TS.

A protective film PF may be positioned under the substrate SB. The protective film PF may protect the display panel 30 in a manufacturing process of the display device. The protective film PF may include a polymer such as polyethylene terephthalate (PET), a silicone-based polymer (e.g., polydimethylsiloxane (PDMS)), and an elastomer (e.g., an elastomeric polyurethane (EPU)).

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure.

What is claimed is:

1. A hinge comprising:
- a first shaft and a second shaft that are parallel to each other;
- a first arm rotatably coupled to the first shaft and including a first rotary cam;
- a second arm rotatably coupled to the second shaft and including a second rotary cam;
- a third arm rotatably coupled to the first shaft and including a third rotary cam;
- a fourth arm rotatably coupled to the second shaft and including a fourth rotary cam;
- a first sliding part coupled to the first shaft and the second shaft to be movable along the first shaft and the second shaft and including a first sliding cam facing the first rotary cam and a second sliding cam facing the second rotary cam;
- a second sliding part coupled to the first shaft and the second shaft to be movable along the first shaft and the second shaft and including a third sliding cam facing the third rotary cam and a fourth sliding cam facing the fourth rotary cam; and
- an elastic member disposed between the first sliding part and the second sliding part,
- wherein the first sliding part and the second sliding part are each configured to linearly move toward each other to compress the elastic member disposed therebetween.

2. The hinge of claim 1, wherein
- the first sliding part and the second sliding part linearly move towards or away from each other in response to rotations of the first arm, the second arm, the third arm, and the fourth arm, and
- the elastic member is compressed or stretched in response to linear movements of the first sliding part and the second sliding part.

3. The hinge of claim 1, wherein the elastic member includes:
- a first elastic member disposed between the first sliding cam and the third sliding cam;
- a second elastic member disposed between the second sliding cam and the fourth sliding cam; and
- a third elastic member disposed between the first elastic member and the second elastic member.

4. The hinge of claim 3, wherein the first elastic member surrounds the first shaft, and the second elastic member surrounds the second shaft.

5. The hinge of claim 3, further comprising
- a pin coupled to the first sliding part and the second sliding part,
- wherein the third elastic member surrounds the pin.

6. The hinge of claim 1, further comprising:
- a first bracket connecting the first arm and the third arm; and
- a second bracket connecting the second arm and the fourth arm.

7. The hinge of claim 1, further comprising:
- a first connection gear and a second connection gear that are disposed between the first arm and the second arm and engaged with each other; and
- a third connection gear and a fourth connection gear that are disposed between the third arm and the fourth arm and engaged with each other,
- wherein the first arm, the second arm, the third arm, and the fourth arm include gears respectively engaging with the first connection gear, the second connection gear, the third connection gear, and the fourth connection gear.

8. The hinge of claim 7, wherein by engagement between the gears of the first arm, the second arm, the third arm, and the fourth arm and the first connection gear, the second connection gear, the third connection gear, and the fourth connection gear, the second arm and the fourth arm rotate counterclockwise around the second shaft in case that the first arm and the third arm rotate clockwise around the first shaft.

9. A hinge comprising:
- a first shaft and a second shaft that are parallel to each other;
- a first arm rotatably coupled to the first shaft and including a first rotary cam;
- a second arm rotatably coupled to the second shaft and including a second rotary cam;
- a third arm rotatably coupled to the first shaft and including a third rotary cam;
- a fourth arm rotatably coupled to the second shaft and including a fourth rotary cam;
- a first sliding part coupled to the first shaft and the second shaft to be movable along the first shaft and the second shaft and including a first sliding cam facing the first rotary cam and a second sliding cam facing the second rotary cam;
- a second sliding part coupled to the first shaft and the second shaft to be movable along the first shaft and the second shaft and including a third sliding cam facing the third rotary cam and a fourth sliding cam facing the fourth rotary cam; and
- an elastic member disposed between the first sliding part and the second sliding part,
- wherein the elastic member includes:
  - a first elastic member disposed between the first sliding cam and the third sliding cam;
  - a second elastic member disposed between the second sliding cam and the fourth sliding cam; and
  - a third elastic member disposed between the first elastic member and the second elastic member, and
- wherein an end of each of the first elastic member, the second elastic member, and the third elastic member is in physical contact with the first sliding part, and
- another end of each of the first elastic member, the second elastic member, and the third elastic member is in physical contact with the second sliding part.

10. A foldable display device comprising:
- a first body;
- a second body; and a hinge unit physically connected to the first body and the second body, the hinge unit including a hinge housing and a hinge coupled to the hinge housing, the hinge including:

a first fixing member and a second fixing member that are coupled to the hinge housing and spaced apart from each other in a direction of a rotation axis of the foldable display device;

a first shaft and a second shaft that are inserted into the first fixing member and the second fixing member and parallel to the rotation axis;

a first arm rotatably coupled to the first shaft and including a first rotary cam;

a second arm rotatably coupled to the second shaft and including a second rotary cam;

a third arm rotatably coupled to the first shaft and including a third rotary cam;

a fourth arm rotatably coupled to the second shaft and including a fourth rotary cam;

a first sliding part coupled to the first shaft and the second shaft to be movable along the first shaft and the second shaft and including a first sliding cam facing the first rotary cam and a second sliding cam facing the second rotary cam;

a second sliding part coupled to the first shaft and the second shaft to be movable along the first shaft and the second shaft and including a third sliding cam facing the third rotary cam and a fourth sliding cam facing the fourth rotary cam; and an elastic member disposed between the first sliding part and the second sliding part, wherein the first sliding part and the second sliding part are each configured to linearly move toward each other to compress the elastic member disposed therebetween.

11. The foldable display device of claim 10, wherein the first arm, the second arm, the third arm, and the fourth arm are disposed between the first fixing member and the second fixing member in the direction of the rotation axis.

12. The foldable display device of claim 10, wherein the first sliding part and the second sliding part are disposed between the first and second arms and the third and fourth arms in the direction of the rotation axis.

13. The foldable display device of claim 10, wherein the first sliding part and the second sliding part linearly move towards or away from each other in response to rotations of the first arm, the second arm, the third arm, and the fourth arm, and the elastic member is compressed or stretched in response to linear movements of the first sliding part and the second sliding part.

14. The foldable display device of claim 10, wherein the elastic member includes:

a first elastic member disposed between the first sliding cam and the third sliding cam;

a second elastic member disposed between the second sliding cam and the fourth sliding cam; and a third elastic member disposed between the first elastic member and the second elastic member.

15. The foldable display device of claim 14, wherein:

an end of each of the first elastic member, the second elastic member, and the third elastic member is supported by the first sliding part, and another end of each of the first elastic member, the second elastic member, and the third elastic member is supported by the second sliding part.

16. The foldable display device of claim 15, wherein the hinge further comprises a pin coupled to the first sliding part and the second sliding part, the first elastic member surrounds the first shaft, the second elastic member surrounds the second shaft, and the third elastic member surrounds the pin.

17. The foldable display device of claim 10, wherein the hinge further comprises:

a first bracket connecting the first arm and the third arm; and a second bracket connecting the second arm and the fourth arm.

18. The foldable display device of claim 10, wherein the hinge further comprises:

a first connection gear and a second connection gear disposed between the first arm and the second arm and that are engaged with each other; and a third connection gear and a fourth connection gear disposed between the third arm and the fourth arm and that are engaged with each other, the first arm, the second arm, the third arm, and the fourth arm include gears respectively engaging with the first connection gear, the second connection gear, the third connection gear, and the fourth connection gear.

* * * * *